(12) United States Patent
Lee et al.

(10) Patent No.: US 7,492,004 B2
(45) Date of Patent: Feb. 17, 2009

(54) TRANSISTORS HAVING A CHANNEL REGION BETWEEN CHANNEL-PORTION HOLES AND METHODS OF FORMING THE SAME

(75) Inventors: Jin-Woo Lee, Gyeonggi-do (KR); Tae-Young Chung, Gyeonggi-do (KR); Yong-Sung Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 154 days.

(21) Appl. No.: 11/054,104

(22) Filed: Feb. 8, 2005

(65) Prior Publication Data
US 2005/0179075 A1      Aug. 18, 2005

(30) Foreign Application Priority Data
Feb. 13, 2004   (KR) ...................... 10-2004-0009776

(51) Int. Cl.
*H01L 29/94* (2006.01)
(52) U.S. Cl. .................. 257/330; 257/331; 257/332; 257/333; 257/334
(58) Field of Classification Search ................. 257/330, 257/331, 332, 333, 334
See application file for complete search history.

(56) References Cited
U.S. PATENT DOCUMENTS
5,817,558 A    10/1998  Wu

| | | | |
|---|---|---|---|
| 5,945,708 A * | 8/1999 | Tihanyi .................. 257/331 |
| 6,124,608 A * | 9/2000 | Liu et al. ................ 257/315 |
| 2001/0003367 A1* | 6/2001 | Hshieh et al. ........... 257/330 |
| 2001/0054734 A1 | 12/2001 | Koth et al. |
| 2003/0205740 A1 | 11/2003 | Ahn |
| 2004/0094799 A1* | 5/2004 | Nakamura ............... 257/330 |
| 2004/0119103 A1* | 6/2004 | Thapar ................... 257/270 |

FOREIGN PATENT DOCUMENTS
JP          06-224429        12/1994

OTHER PUBLICATIONS
English language abstract of Japanese Publication No. 06-224429.

* cited by examiner

*Primary Examiner*—Evan Pert
*Assistant Examiner*—Tan N Tran
(74) *Attorney, Agent, or Firm*—Marger Johnson & McCollom, P.C.

(57) ABSTRACT

According to some embodiments of the invention, transistors have channel regions between channel-portion holes. Methods of forming the same include at least two channel-portion holes disposed in a semiconductor substrate. Line patterns are formed in parallel to be spaced apart from each other on a main surface of the semiconductor substrate to fill the channel-portion holes. A channel region is disposed in the semiconductor substrate below the line patterns. At this time, the channel region is formed between the channel-portion holes and also covers lower portions of the channel-portion holes. Driving current capability and refresh characteristics of DRAMs utilizing the inventive transistors are improved.

14 Claims, 14 Drawing Sheets

TRANSISTORS HAVING A CHANNEL REGION BETWEEN CHANNEL-PORTION HOLES AND METHODS OF FORMING THE SAME

CROSS-REFERENCE TO RELATED APPLICATION

This patent application claims priority from Korean Patent Application No. 10-2004-0009776, filed Feb. 13, 2004, the contents of which are hereby incorporated by reference in their entirety.

BACKGROUND OF THE INVENTION

1. Field of the Invention

The invention relates to semiconductor devices and methods of forming the same and, more specifically, to transistors having a channel region between channel-portion holes and methods of forming the same.

2. Description of the Related Art

Generally, semiconductor devices include discrete elements to place data input by a user in a desired place. The discrete elements include a capacitor for storing data and a transistor for transmitting the data to the capacitor through a line.

The transistor includes a gate pattern disposed on a semiconductor substrate, source and drain regions formed in the semiconductor substrate to overlap the gate pattern, and a channel region disposed in the semiconductor substrate under the gate pattern to transmit user's data. When a voltage is applied to the gate pattern, and the source and drain regions to drive the transistor, the channel region serves as a data transmission route between the source region and the drain region.

However, as a design rule of the semiconductor device is reduced, the channel region and the gate pattern become smaller areas in the transistor. To cope with this change, the channel region is formed by at least one ion implantation process, which is performed in the semiconductor substrate. The channel-portion hole is disposed to extend from a top surface of the semiconductor substrate to a lower region thereof by a predetermined depth, and to contact the channel region. There is provided a gate pattern that fills the channel-portion hole with the trench shape. The gate pattern provides a data transmission route along the semiconductor substrate that defines the channel-portion hole. As such, if a voltage is applied to both the channel-portion hole and the channel region during the operation of the transistor, a body effect is increased due to the channel region around the channel-portion hole, thereby decreasing current driving capability.

On the other hand, U.S. Pat. No. 5,817,558 to Shye Lin Wu et al (the '558 patent) discloses a method of forming a t-gate lightly-doped drain semiconductor device. According to the '558 patent, this method includes forming a pad oxide layer on the semiconductor substrate. A lightly doped layer is formed around the pad oxide layer by implanting impurity ions into the semiconductor substrate, and a first insulating layer is formed on the pad oxide layer. An aperture is formed in the first insulating layer, and a sidewall spacer is formed on the sidewall of the aperture.

The method includes performing an etching process in the semiconductor substrate by using the first insulating layer and the sidewall spacers as an etch mask to form a groove in the substrate. At this time, the sidewall spacers are also removed. A gate oxide layer is formed in and around the groove, and a gate material layer, which fills the aperture and the groove, is formed on the first insulating layer.

Further, the method includes partially performing an etching process in the gate material layer to form a T-shaped gate in the aperture and the groove. Subsequently, the first insulating layer is removed. Heavily doped source and drain layers are formed on the lightly doped layer so that they are arranged at both sides of the T-shaped gate.

However, the method further includes forming an anti-punch-through layer to prevent a contact between the source and the drain in the semiconductor substrate having the groove. The anti-punch-through layer is arranged along the groove to reduce an impurity concentration of the lightly doped layer adjacent to the groove, thereby causing a current leakage while driving the semiconductor device. This is because the lightly doped layer and the anti-punch-through layer have different conductivity types from each other. Furthermore, since the gate oxide layer is partially etched, characteristics of the semiconductor device may be degraded due to the etching damage of the oxide layer.

SUMMARY OF THE INVENTION

According to some embodiments of the invention, there are provided transistors having a channel region between at least two channel-portion holes suitable for increasing current driving capability, and methods of forming the same.

And there are provided transistors of DRAM cells having a channel region, which is disposed on the semiconductor substrate below a bit line node rather than below a capacitor node, between at least two channel-portion holes to improve current driving capability and refresh characteristics, and methods of forming the same.

BRIEF DESCRIPTION OF THE DRAWINGS

Exemplary embodiments of the invention will be readily apparent to those of ordinary skill in the art upon review of the detailed description that follows when taken in conjunction with the accompanying drawings, in which like reference numerals denote like parts.

DETAILED DESCRIPTION OF THE PREFERRED EMBODIMENTS

Figure 1:
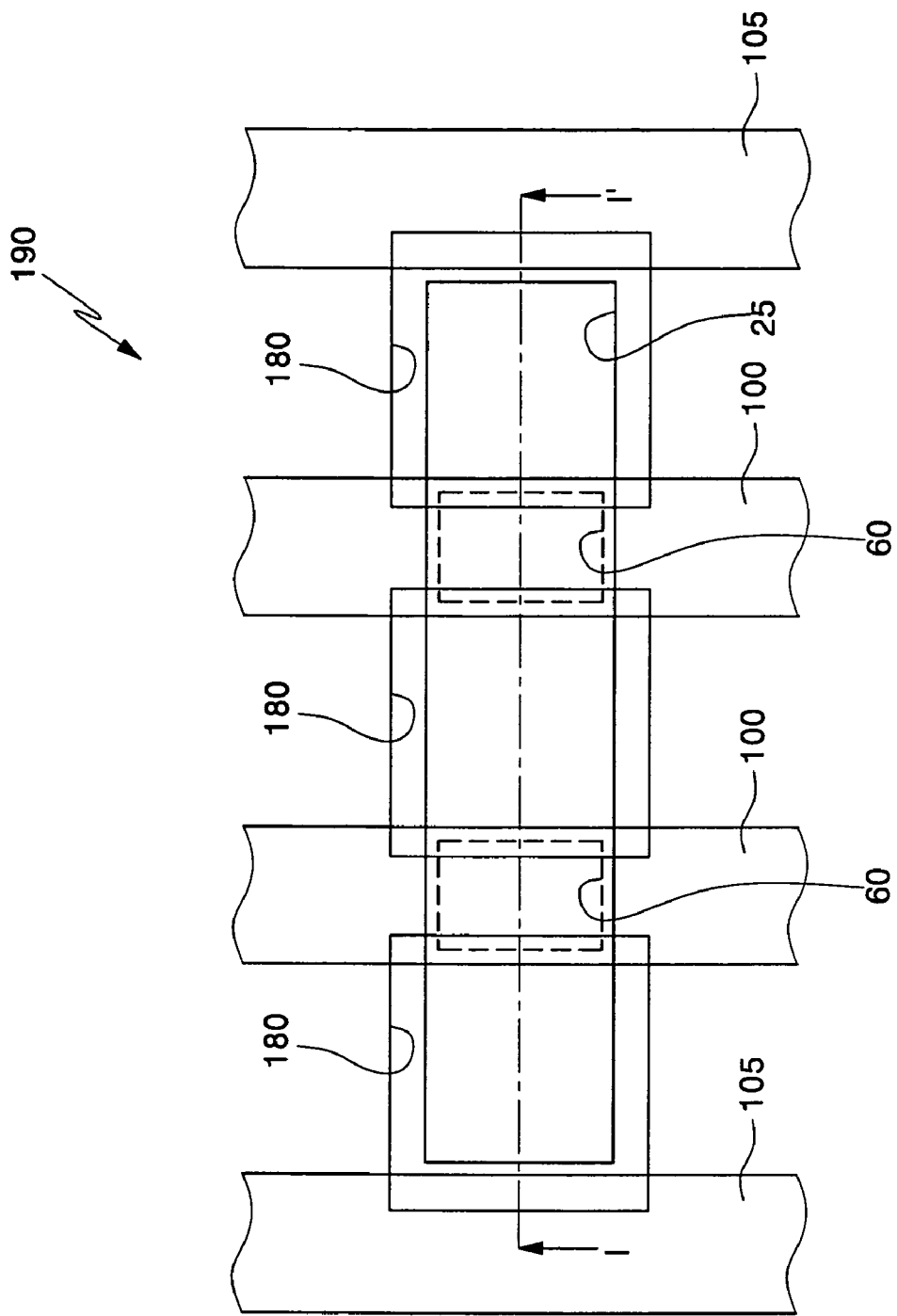
FIG. 1 is a layout of a transistor according to embodiments of the invention.
Figure 2:
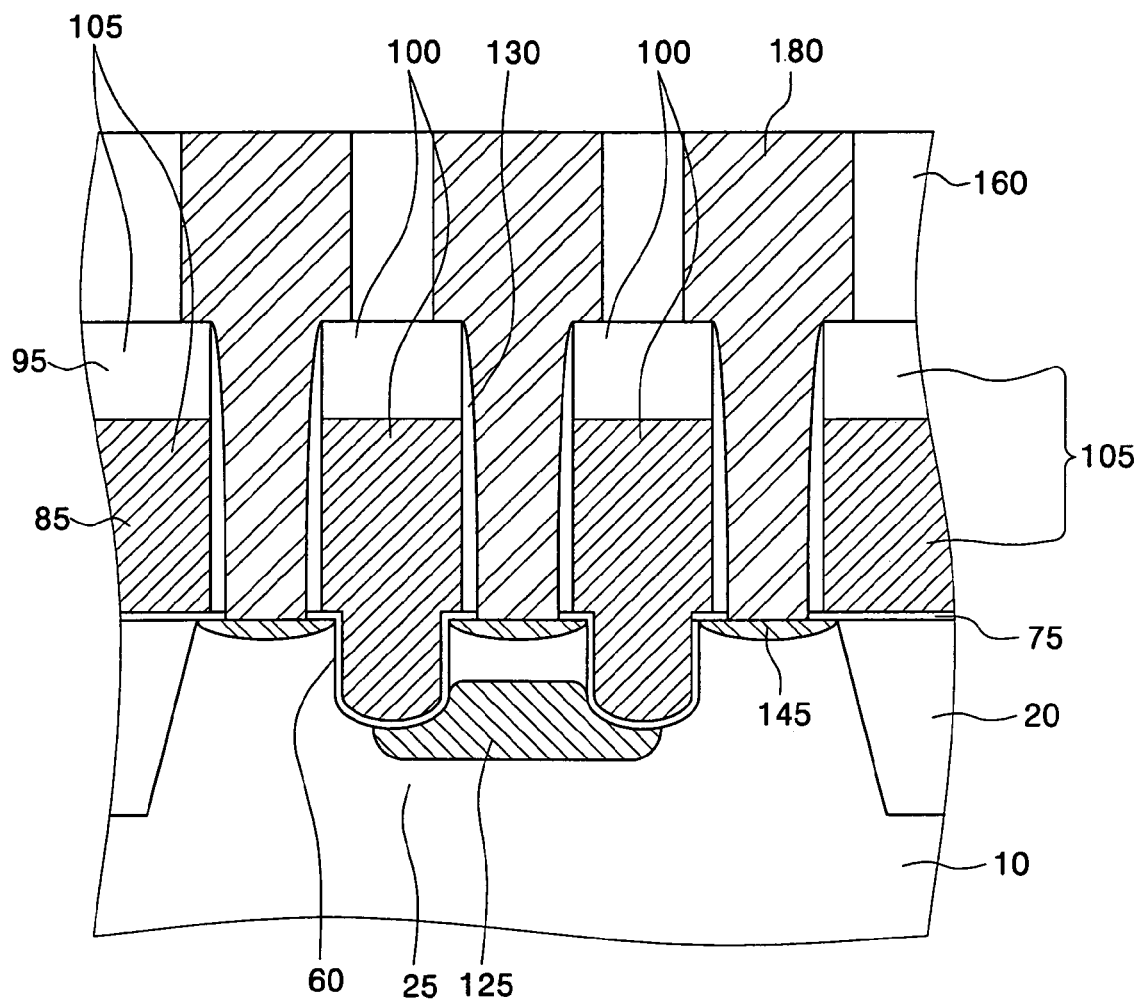
FIG. 2 is a cross-sectional view of a transistor taken along line I-I' of FIG. 1.
Figure 3:
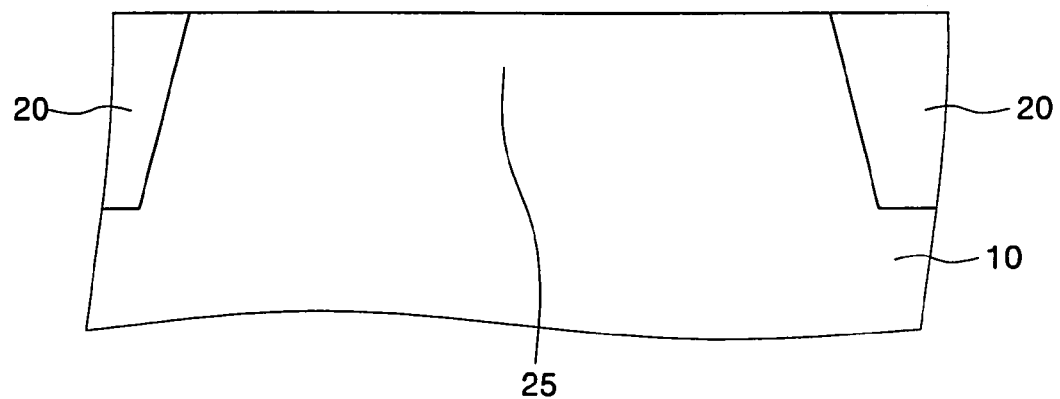
FIGS. 3 to 16 are cross-sectional views illustrating a method of forming a transistor taken along line I-I' of FIG. 1, respectively.
Figure 4:
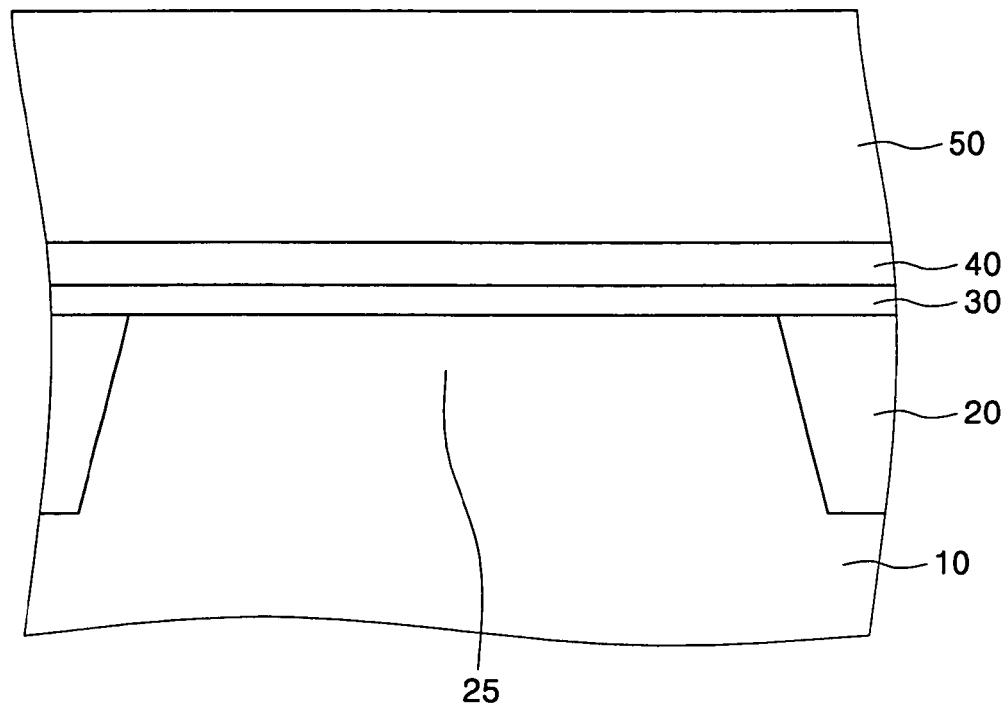

FIG. 1 is a layout of a transistor according to an embodiment of the invention, and FIG. 2 is a cross-sectional view of a transistor taken along line I-I' of FIG. 1.

Referring to FIGS. 1 and 2, a device isolation layer 20 is disposed in a semiconductor substrate 10 having a DRAM cell array region 190, and the device isolation layer 20 defines an active region 25. At least two channel-portion holes 60 are disposed in a trench shape on the semiconductor substrate 10 of the active region 25. A channel region 125, which covers lower portions of the channel-portion holes 60, is also arranged. The channel region 125 and the semiconductor substrate 10 have the same conductivity type. In a peripheral circuit region other than the DRAM cell array region 190, the channel region 125 and the semiconductor substrate 10 may have either the same conductivity type or different conductivity types from each other.

First and second line patterns 100 and 105 are arranged on the active region 25 and the device isolation layer 20, respectively. Each of the first and second line patterns 100 and 105 includes a gate electrode 85 and a gate capping layer pattern 95 stacked thereon. The second line patterns 105 are disposed on the device isolation layer 20 in parallel with and opposite to at least one of the first line patterns 100. At this time, the gate electrode 85 of the first line patterns 100 fill the channel-portion hole 60 arranged in the semiconductor substrate 10 of the active region 25. The gate electrodes 85 comprise a polysilicon layer with n or p conductivity type and a metal silicide layer stacked thereon. The gate electrodes 85 may be the polysilicon layer with the n or p conductivity type. The polysilicon layer has a conductivity type opposite to the channel region 125 in the semiconductor substrate 10. In the peripheral circuit region other than the DRAM cell array region 190, the polysilicon layer and the channel region 125 may have either a same conductivity type or different conductivity types from each other. Preferably, the gate capping layer pattern 95 is a silicon nitride layer ($Si_3N_4$).

Line spacers 130 are disposed on sidewalls of the first and second line patterns 100 and 105, respectively. Preferably, a line insulating layer pattern 75 is disposed below the line spacers 130 as well as the first and second line patterns 100 and 105. The line spacers 130 preferably have the same etching ratio as the gate capping layer pattern 95. Preferably, the line insulating layer pattern 75 has an etching ratio different from the gate capping layer pattern 95, and is one selected from either a silicon oxide layer ($Si_XO_Y$) or a silicon oxynitride layer ($Si_XO_YN_Z$).

Electrode impurity regions 145 are disposed in the semiconductor substrate 10 between the first and second line patterns 100 and 105, wherein the electrode impurity regions 145 overlap the first and second line patterns 100 and 105. The electrode impurity regions 145 have a conductivity type different from the channel region 125, which covers the lower portions of the channel-portion hole 60. Each of the electrode impurity regions 145 refers to source and drain regions of a transistor. Landing pads 180 are disposed between the first and second line patterns 100 and 105, and disposed to extend from an upper portion of the first and second line patterns 100 and 105, wherein the upper sides of the landing pads 180 are covered with an interlayer insulating layer 160 and electrically insulated from each other. Each of the landing pads 180 is disposed on the semiconductor substrate 10 and contacts the electrode impurity regions 145.

A method of forming a transistor according to an embodiment of the invention will now be described with reference to the accompanying drawings and embodiments.

FIGS. 3 to 16 are cross-sectional views illustrating a method of forming a transistor taken along line I-I' of FIG. 1.

Referring to FIG. 1 and FIGS. 3 to 6, a device isolation layer 20 is formed in a semiconductor substrate 10 of a DRAM cell array region 190 to isolate an active region 25, and a pad layer 30, a reflective layer 40 and a photoresist layer 50 are sequentially formed on the semiconductor substrate 10 having the device isolation layer 20. The reflective layer 40 does not be formed when fine photoresist patterns are defined by a photolithography process. Preferably, the semiconductor substrate 10 is formed to have either a p conductivity type or an n conductivity type.

Figure 5:
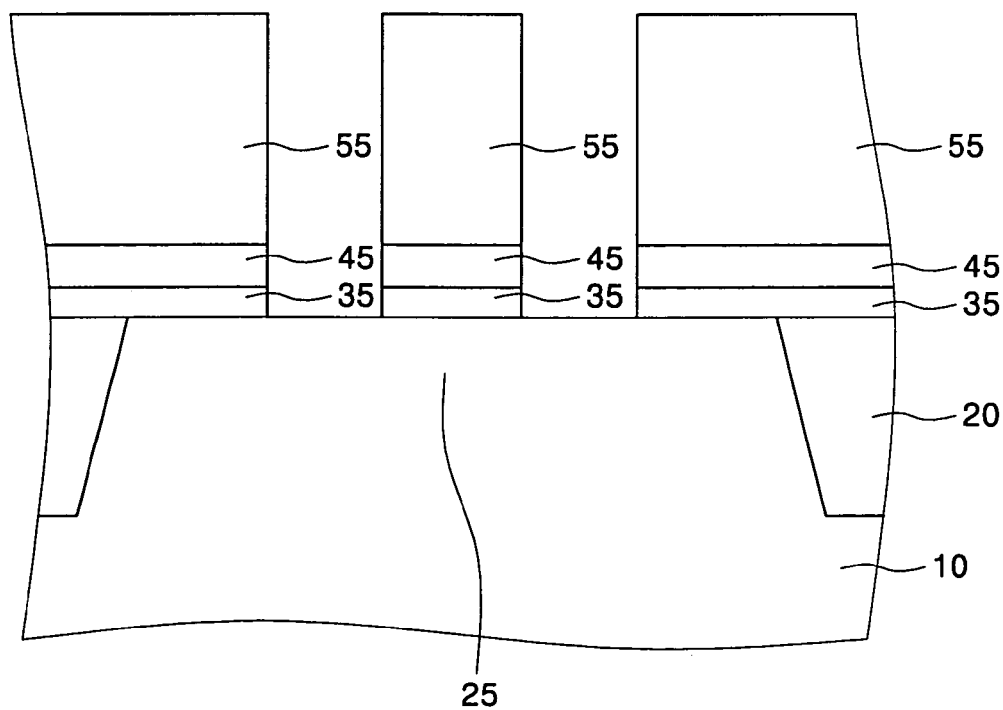

In FIG. 5, a photolithography process is performed in the photoresist layer 50 to form a photoresist pattern 55 on the reflective layer 40, and an etching process is performed in the reflective layer 40 and the pad layer 30 by using the photoresist pattern 55 as an etching mask, to expose the active region 25 of the semiconductor substrate 10. The etching process forms a pad layer pattern 35 and a reflective layer pattern 45 stacked thereon on the semiconductor substrate 10.

Figure 6:
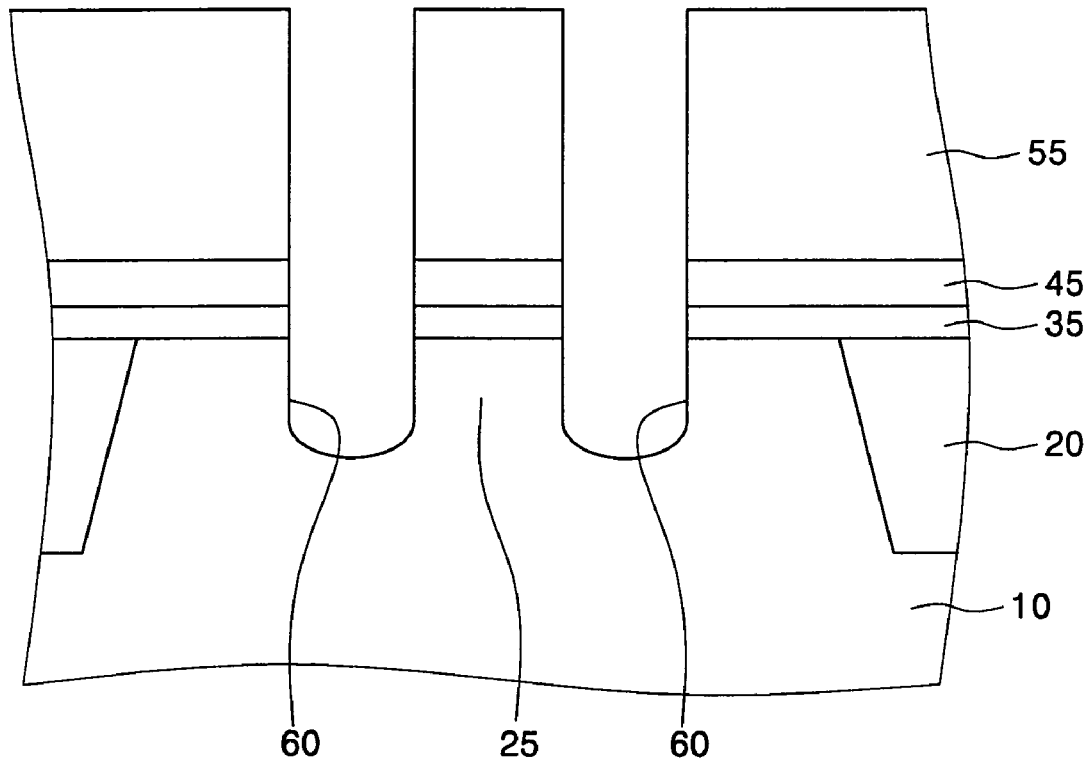
Figure 7:
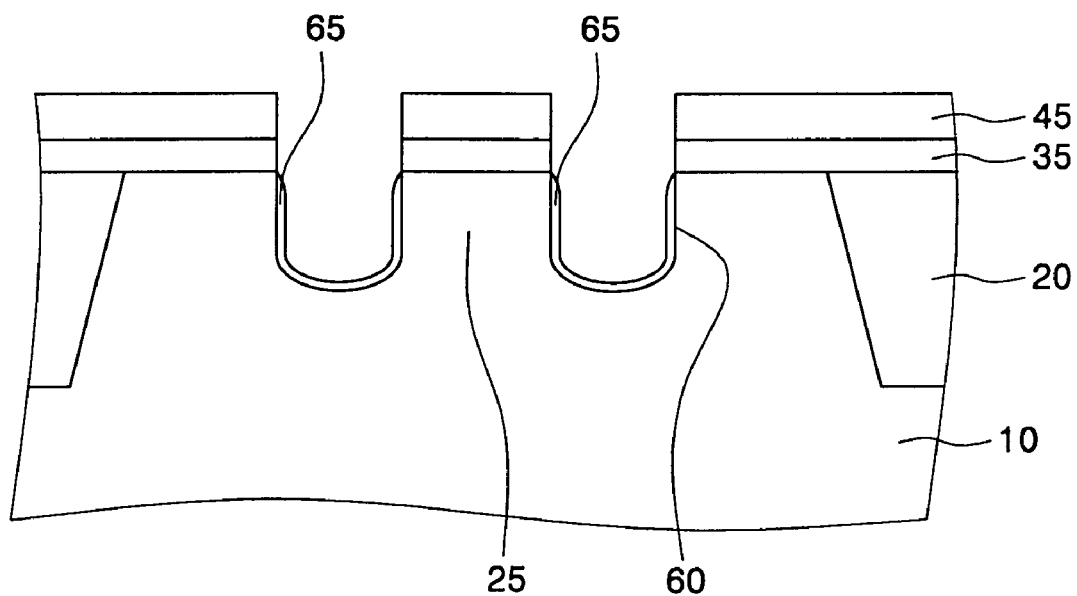
Figure 8:
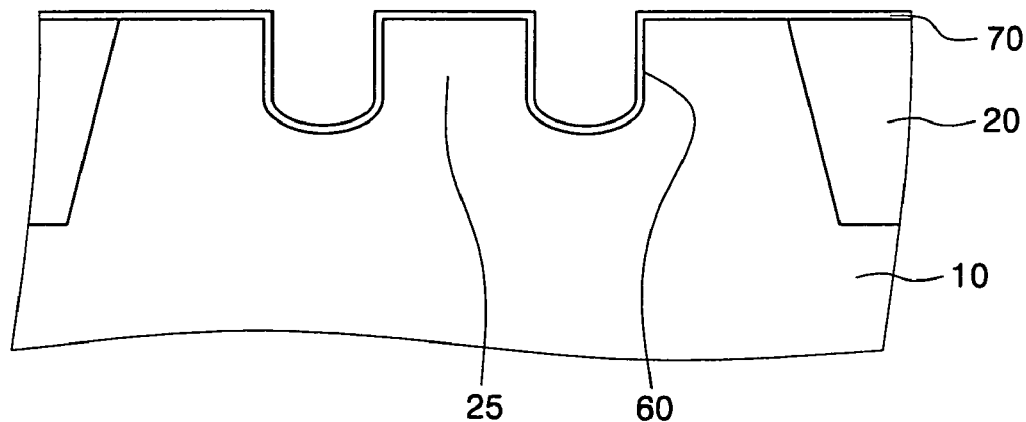
Figure 9:
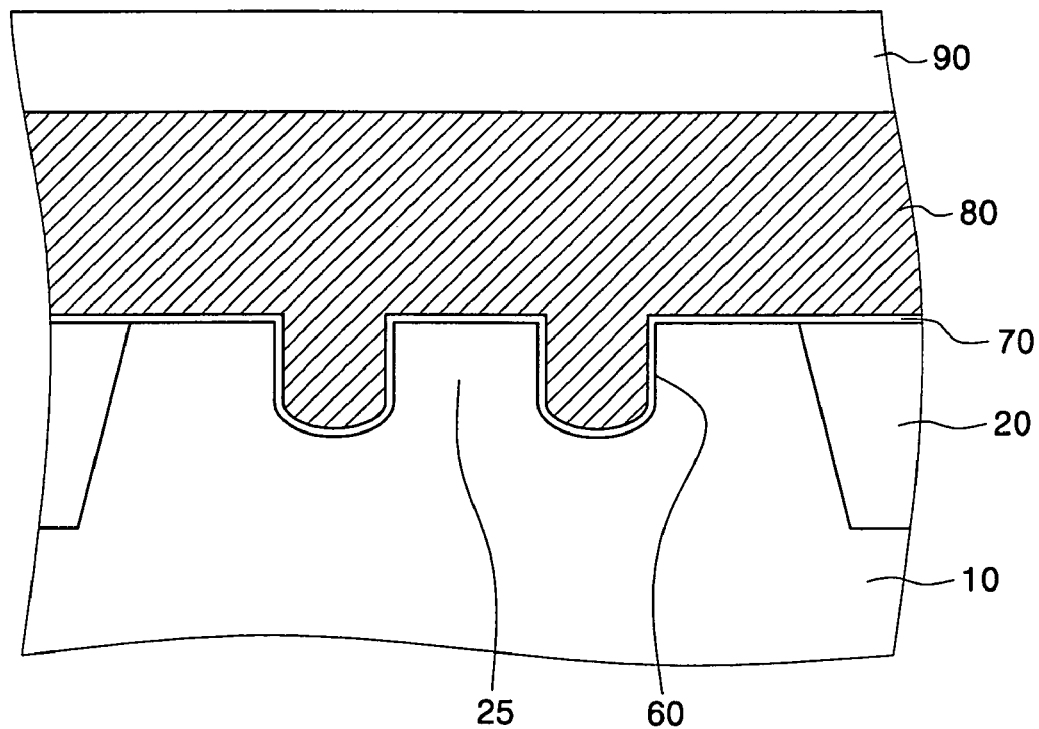
Figure 10:
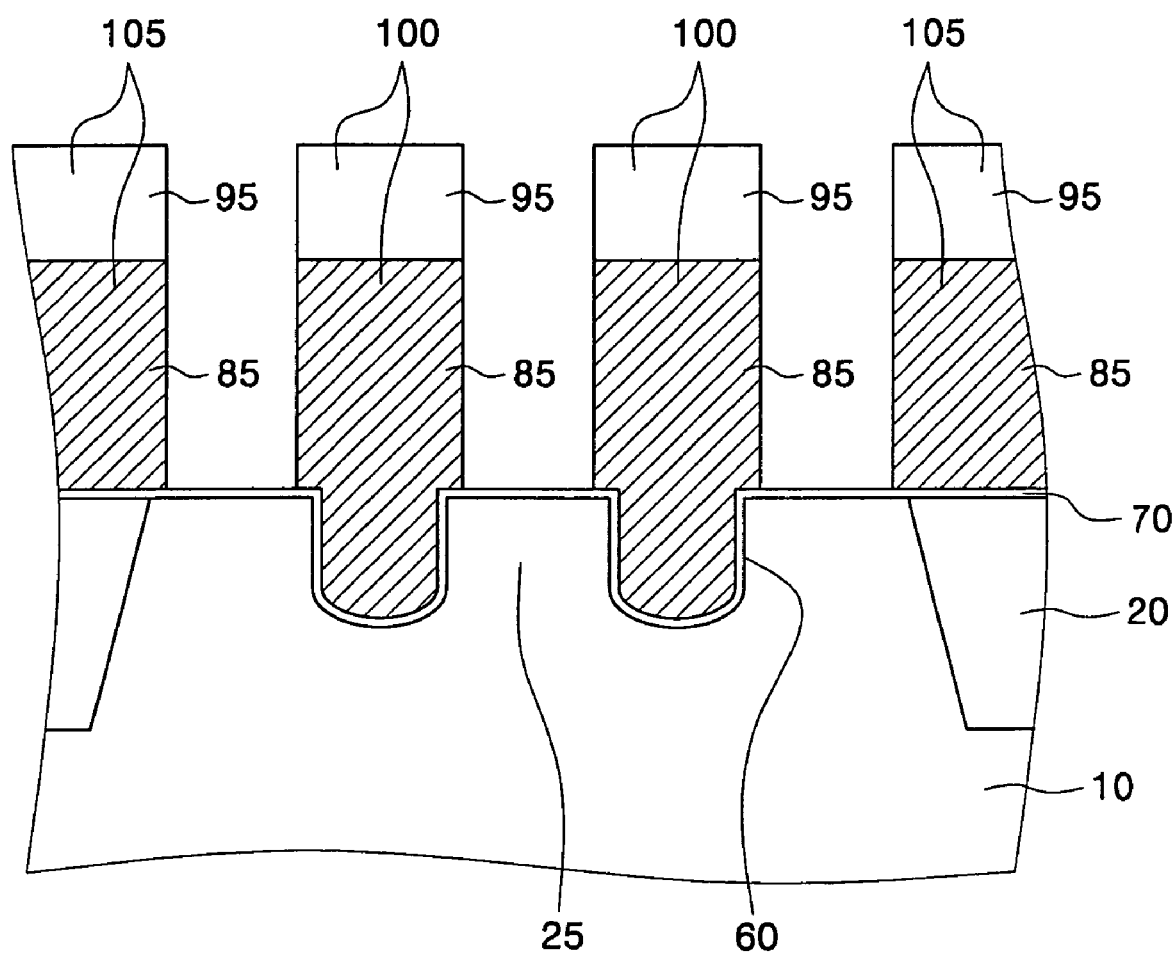

Subsequently, by using the pad layer patterns 35, the photoresist patterns 55, and the reflective patterns 45 as an etching mask, the etching process is performed on the semiconductor substrate 10, as shown in FIG. 6. The etching process forms at least two channel-portion holes 60 to a predetermined depth extending downward from a main surface of the semiconductor substrate 10. The channel-portion holes 60 are disposed in the semiconductor substrate 10 of the active region 25 enclosed by the device isolation layer 20.

Referring to FIG. 1 and FIGS. 7 to 10, the photoresist patterns 55 are removed from the semiconductor substrate 10, and by using the reflective patterns 45 and the pad layer patterns 35 as an oxidation barrier layer, an oxidation process is performed in the semiconductor substrate 10. The oxidation process forms sacrificial layers 65 respectively in the channel-portion holes 60. At this time, the sacrificial layers 65 serve to stabilize interfacial states of the semiconductor substrate having the channel-portion holes 60, and preferably, the sacrificial layers 65 are formed of a silicon dioxide layer ($SiO_2$).

The sacrificial layers 65, the reflective layer patterns 45, and the pad layer patterns 35 are removed from the semiconductor substrate 10. A gate capping layer 90, a line insulating layer 70, and a gate layer 80 are sequentially formed on the semiconductor substrate having the channel-portion holes 60. The line insulating layer 70 is conformally formed in the channel-portion holes 60 to cover the main surface of the semiconductor substrate 10. The gate layer 80 is formed of a polysilicon layer having n or p conductivity type and a metal silicide layer stacked thereon. The gate layer 80 may be formed of the polysilicon layer having either the n or p conductivity type. The polysilicon layer is formed to have a conductivity type opposite to the channel region 125 of FIG. 2. If the polysilicon layer is formed in the peripheral circuit region other than the DRAM cell array region 190, the polysilicon layer is either the same conductivity type as or a different conductivity type from the channel region 125. Preferably, the line insulating layer 70 is formed of a silicon dioxide layer ($SiO_2$), and the gate capping layer 90 is formed of an insulating layer having an etching ratio different from the line insulating layer 70, e.g., $Si_3N_4$.

By using the line insulating layer 70 as an etching stop layer, a photolithography and an etching process are sequentially performed to the gate capping layer 90 and the gate layer 80. Through the photolithography and etching processes, the first and second line patterns 100 and 105 are formed on the line insulating layer 70. Each of first and second line patterns 100 and 105 is formed of a gate electrode 85 and a gate capping layer pattern 95. At this time, the first line patterns 100 are formed to be spaced apart from each other on the active region 25, where the gate electrodes 85 are formed to fill the channel-portion holes 60, and each of the second line patterns are formed on the device isolation layer 20 in parallel with and opposite to at least one of the first line patterns 100.

Figure 11:
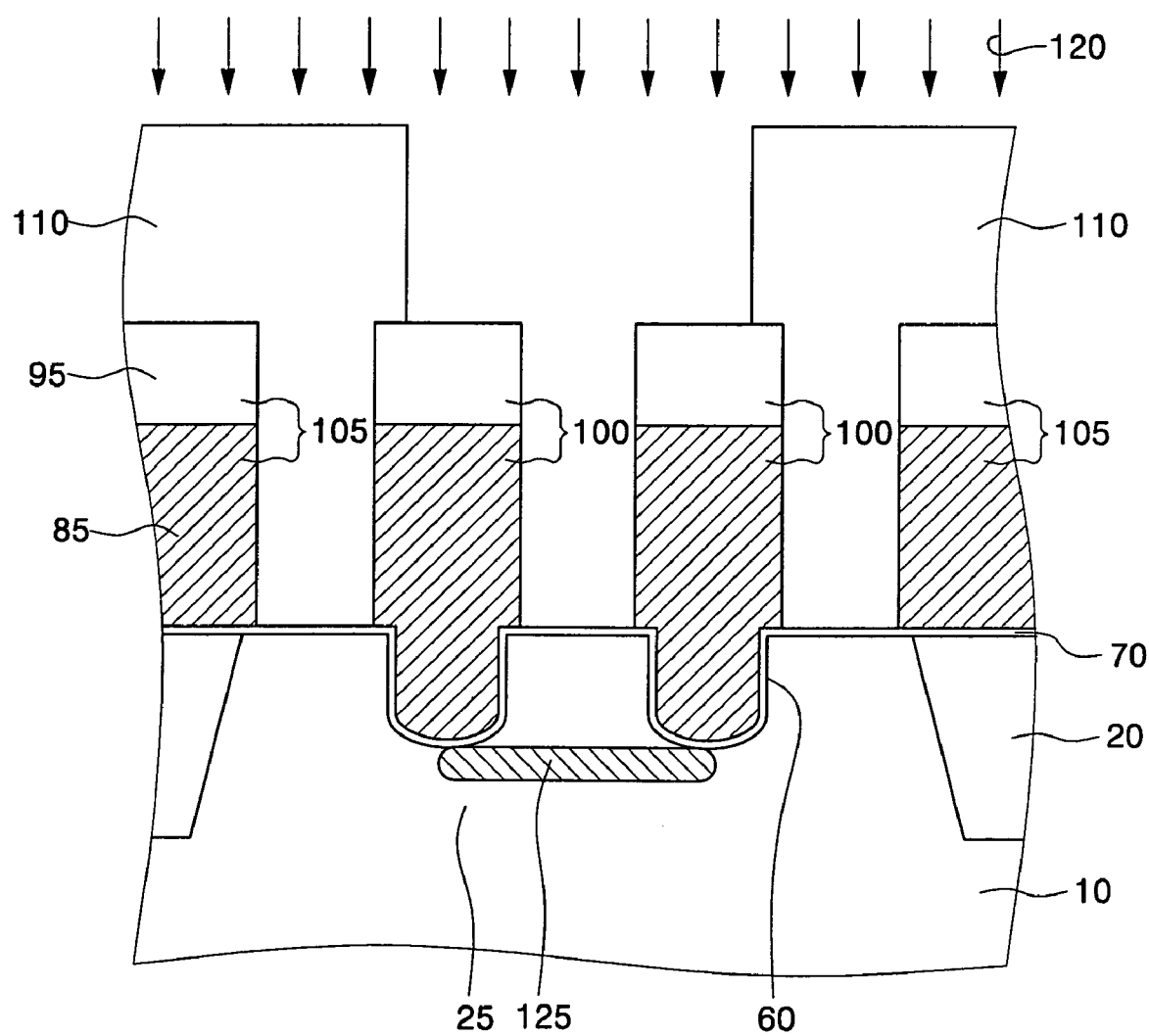
Figure 12:
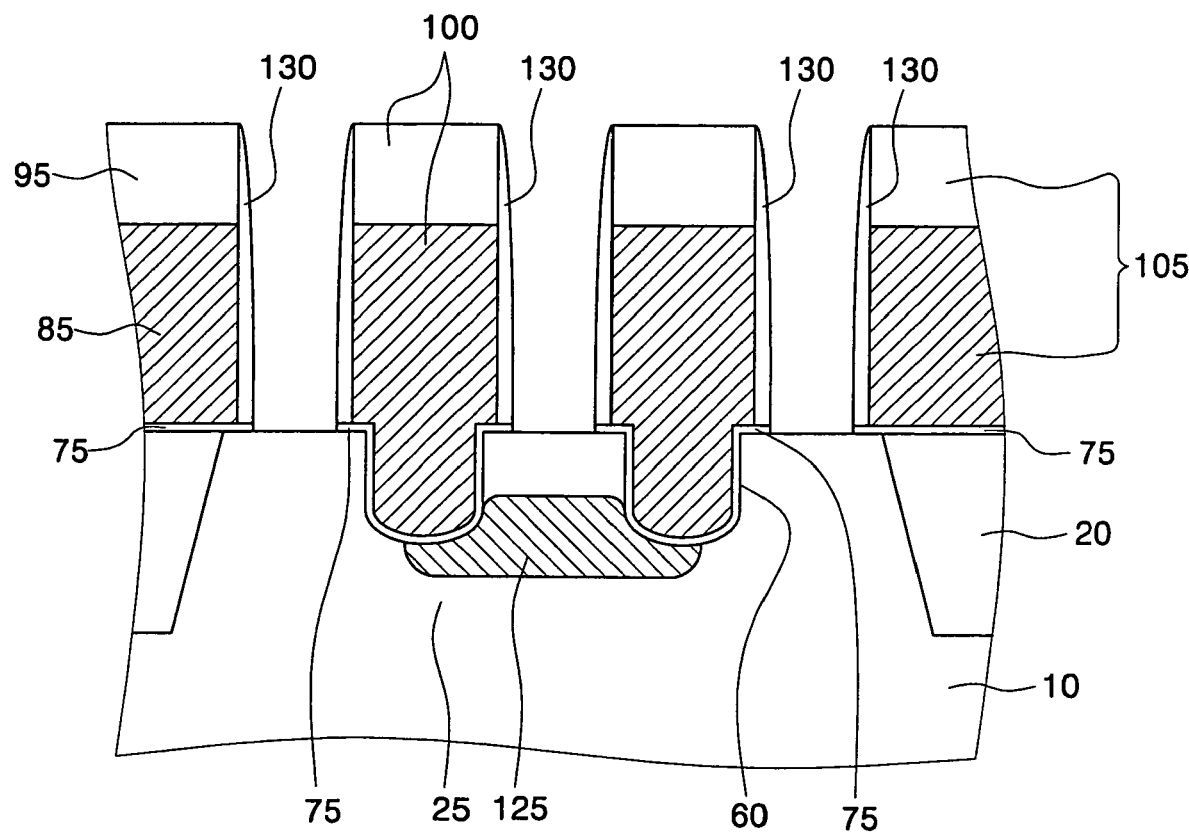

Referring to FIG. 1 and FIGS. 11 and 12, photoresist patterns 110 are formed on the semiconductor substrate having the first and second line patterns 100 and 105, wherein the photoresist patterns 110 are formed to expose the main surface of the semiconductor substrate 10 between the first line patterns 100. By using the photoresist patterns 110 and the first line patterns 100 as a mask, an ion implantation process 120 is performed onto the semiconductor substrate between the channel-portion holes 60 to form a channel region 125. The channel region 125 is formed between the channel-portion holes 60 and to cover the lower portions of the channel-portion holes 60.

To minimize a body effect of a transistor, it is preferable that the channel region 125 is formed to have a predetermined volume in the semiconductor substrate 10 between the first line patterns 100. Preferably, the channel region 125 and the semiconductor substrate 10 have the same conductivity type. Further, if the channel region 125 is formed in the peripheral circuit region other than the DRAM cell array region 190, the channel region 125 is formed to have a conductivity type different from the semiconductor substrate 10 or the same conductivity type as the semiconductor substrate 10.

Next, as shown in FIG. 12, the line spacers 130 are formed on sidewalls of the first and second line patterns 100 and 105. The line spacers 130 are formed to expose the semiconductor substrate 10 therebetween, and line insulating layer patterns 75 are formed below the line spacers 130 and the first and second line patterns 100 and 105. Preferably, the line spacers 130 are formed of an insulating layer having the same etching ratio as the gate capping layer pattern 95. While forming the line spacers 130, the channel region 125 is diffused along the semiconductor substrate 10 defining the channel-portion holes 60.

Figure 13:
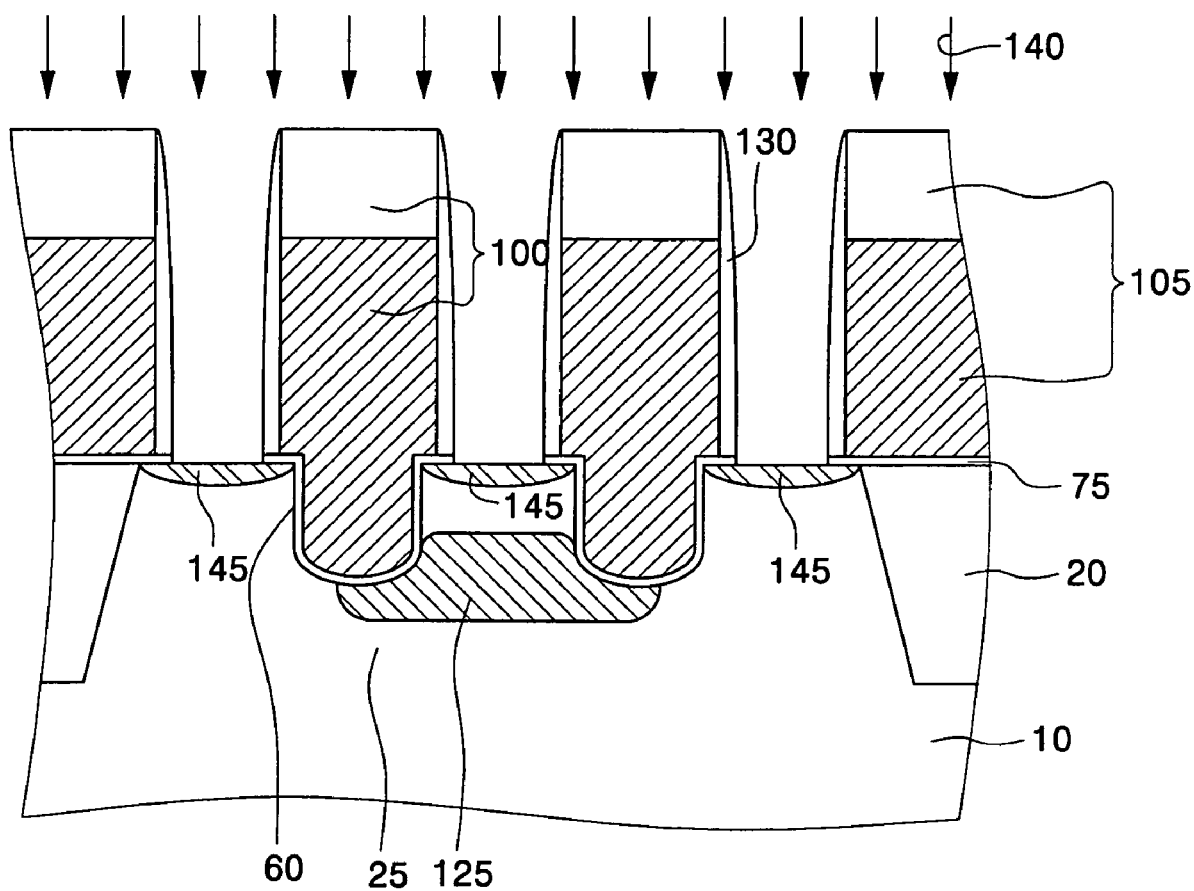
Figure 14:
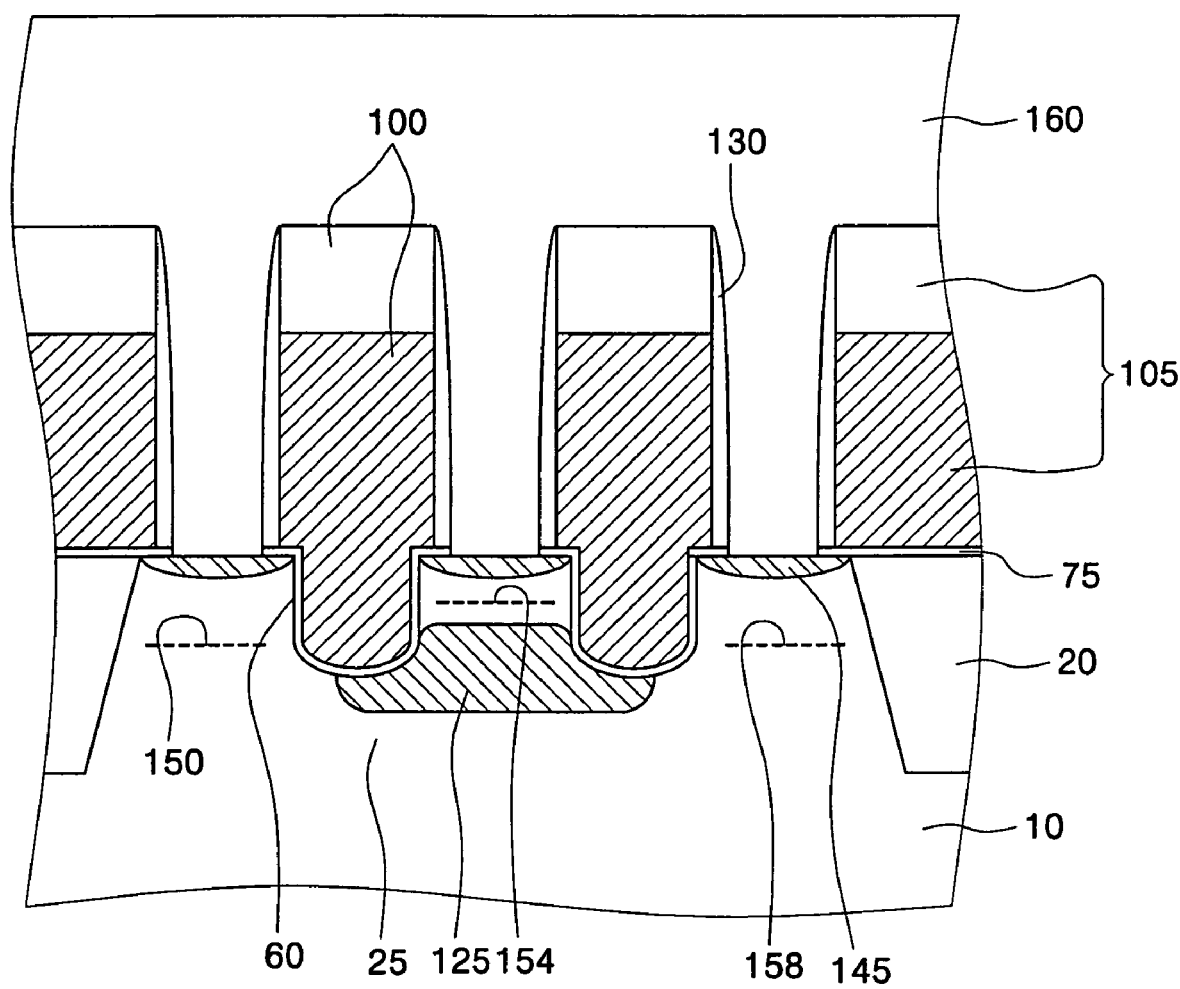

Referring to FIG. 1 and FIGS. 13 and 14, by using the line spacers 130 as well as the first and second line patterns 100 and 105 as a mask, an ion implantation process 140 is performed onto the semiconductor substrate 10 to form electrode impurity regions 145. The electrode impurity regions 145 are formed to overlap the first and second line patterns 100 and 105. Further, the electrode impurity regions 145 are formed to have a conductivity type different from that of the channel region 125, and the electrode impurity regions 145 are formed to have a dose higher than that of the channel region 125. Electrode impurity region 145 refers to source and drain regions of the transistor.

Next, in FIG. 14, an interlayer insulating layer 160 is formed on the semiconductor substrate having the electrode impurity regions 145, to sufficiently cover the first and second line patterns 100 and 105. At this time, while forming the interlayer insulating layer 160, each of the electrode impurity regions 145 is diffused toward the lower portion of the channel-portion holes 60 to contact the semiconductor substrate 10 and the channel region 125, thereby forming PN junctions 150, 154, and 158. Of the PN junctions, the selected two junctions 150 and 158 are formed to be deeper than the rest 154 below the main surface of the semiconductor substrate 10. This is because the electrode impurity region 145 between the first line patterns 100 is not diffused due to being blocked by the channel region 125 disposed between the channel-portion holes 60.

Figure 15:
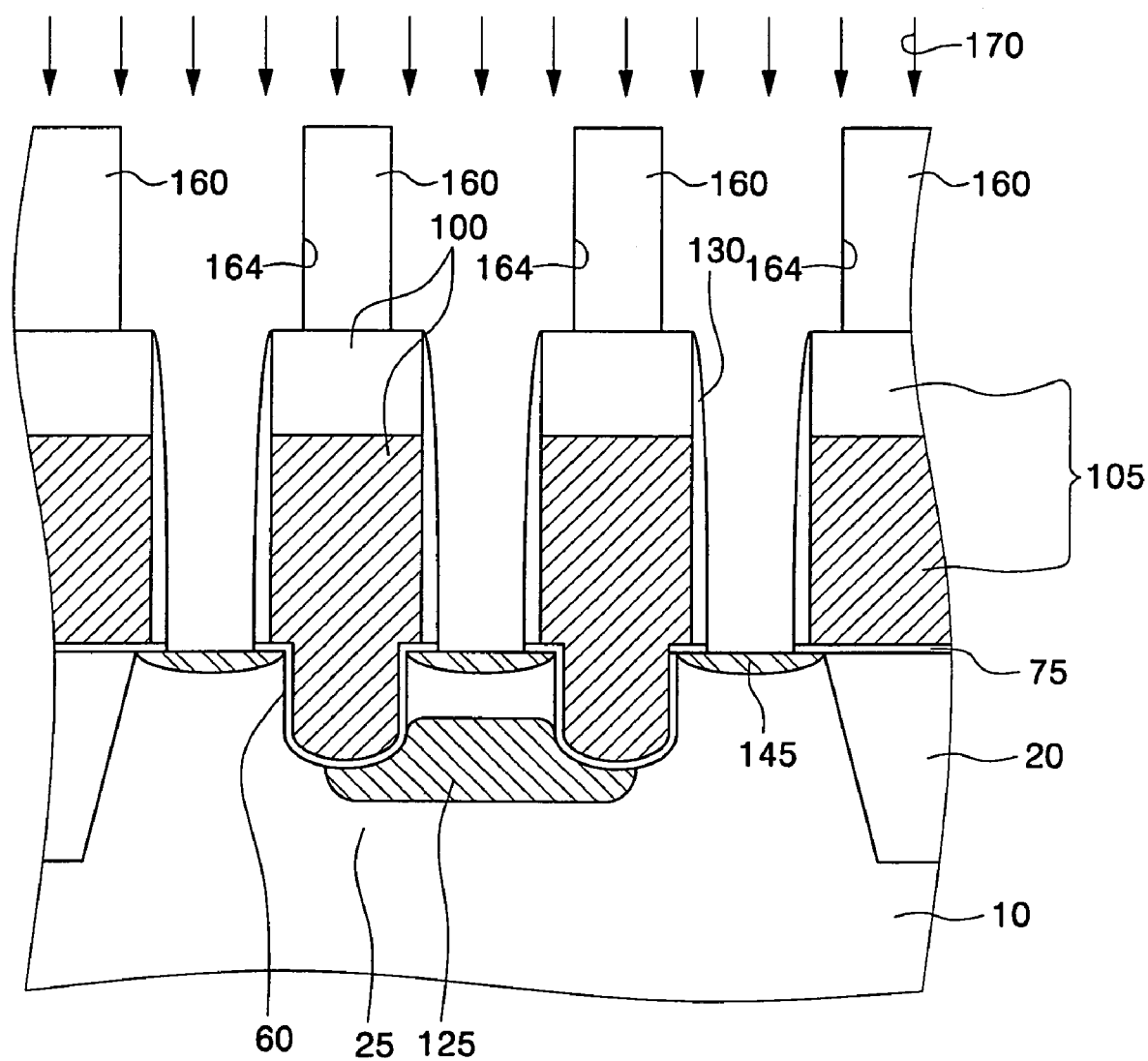
Figure 16:
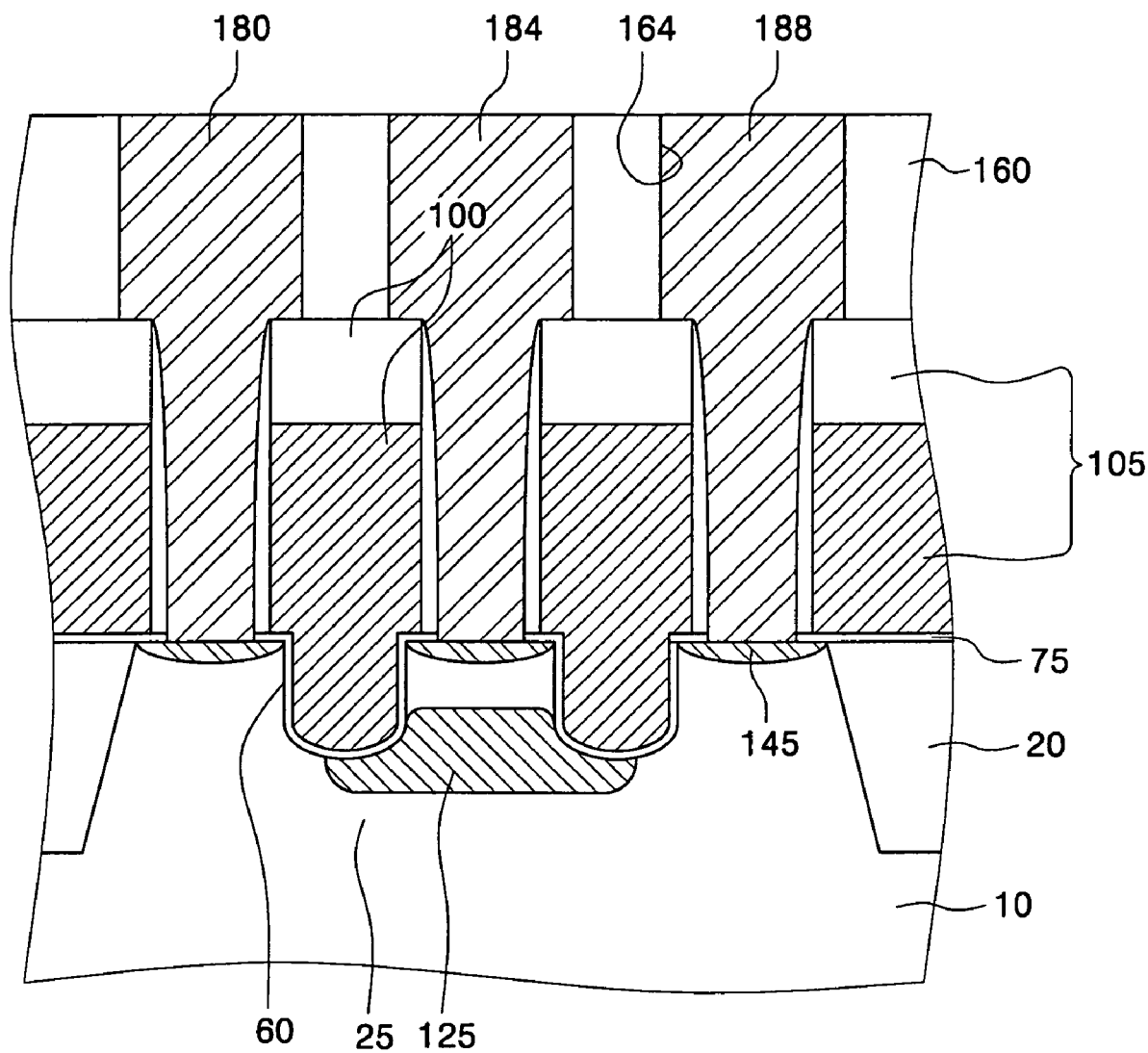

Referring to FIG. 1 and FIGS. 15 and 16, landing pad holes 164 are formed that penetrate the interlayer insulating layer 160 between the first and second line patterns 100 and 105. Preferably, the landing pad holes 164 are formed so that the diameter of the upper portion is bigger than that of the lower portion.

Subsequently, in FIG. 16, landing pads 180, 184 and 188 are formed to fill the landing pad holes 164, respectively. The landing pads 180, 184 and 188 are formed to contact the electrode impurity regions 145, respectively. At this time, before forming the landing pads 180, 184 and 188, an ion implantation process 170 may be performed. This is performed to improve characteristics of the transistor or contact resistance between the landing pads 180, 184 and 188, and the electrode impurity regions 145. Preferably, the landing pads 180, 184 and 188 are formed of a polysilicon layer having the same conductivity type as the electrode impurity regions 145.

A DRAM having the transistor uses the landing pads 180, 184 and 188 as electrical nodes of the source and drain regions of the transistor, respectively. Further, of the landing pads, two landing pads 180 and 188 are used as electrical nodes of capacitors and the rest 184 is used as a electrical node of a bit-line. At this time, the two landing pads 180 and 188 dispose therebelow the PN junctions 150 and 158 of FIG. 14, respectively. The refresh characteristics are further improved in the PN junctions 150 and 158 compared to the case where the PN junctions 150 and 158 are formed around the main surface of the semiconductor substrate 10. This is because any physical damage from the semiconductor fabrication processes that progressed before the formation of the landing pads 180, 184 and 188 are sufficiently covered with the electrode impurity regions 145 to reduce the leakage current of the capacitor. The physical damage may be generated in the semiconductor substrate 10 by the etching processes and the ion implantation processes, and are typically generated around the main surface of the semiconductor substrate 10.

Figure 17:
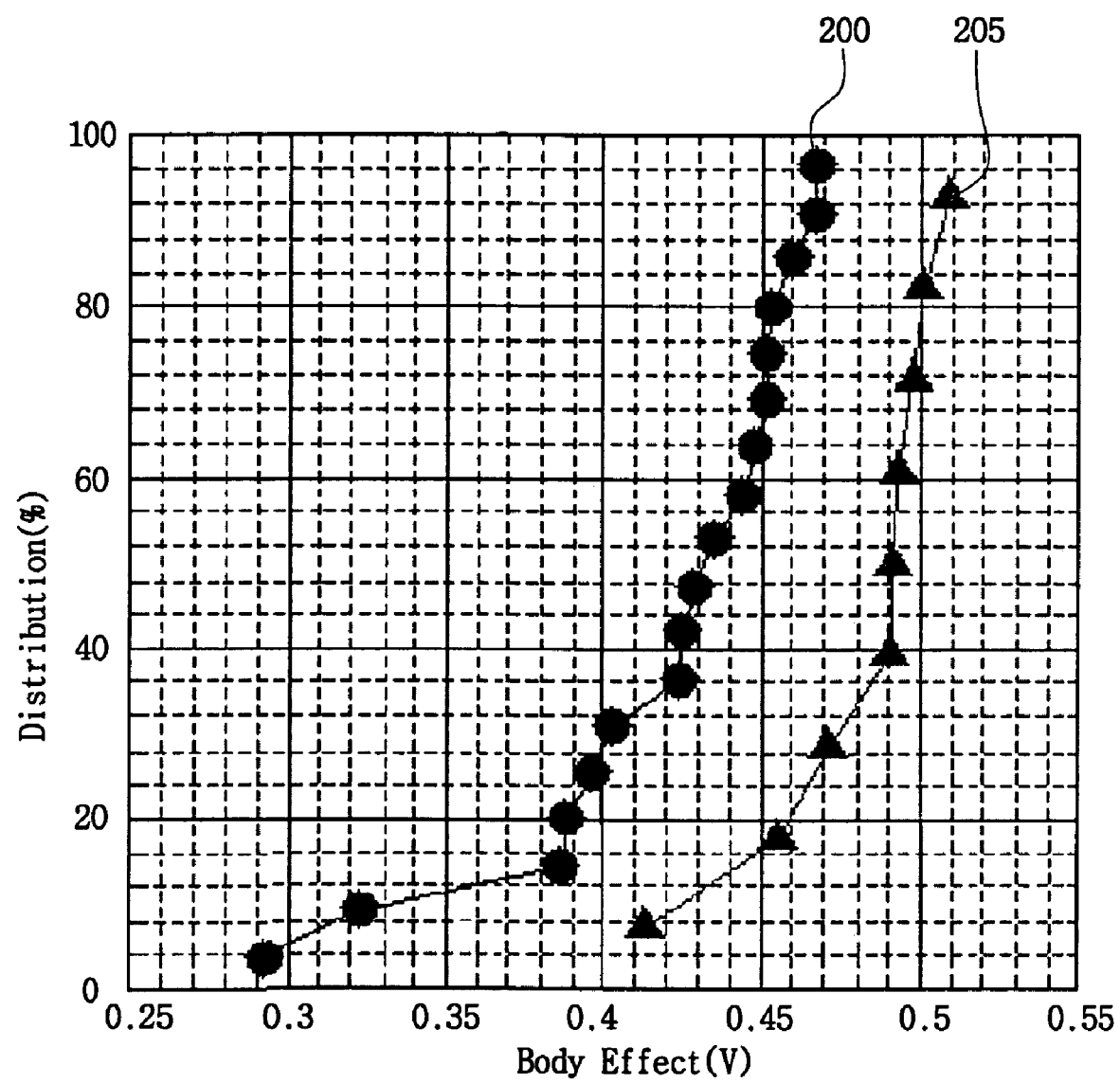
FIGS. 17 and 18 are graphs showing electrical characteristics of a DRAM having a transistor according to an embodiment of the invention.
Figure 18:
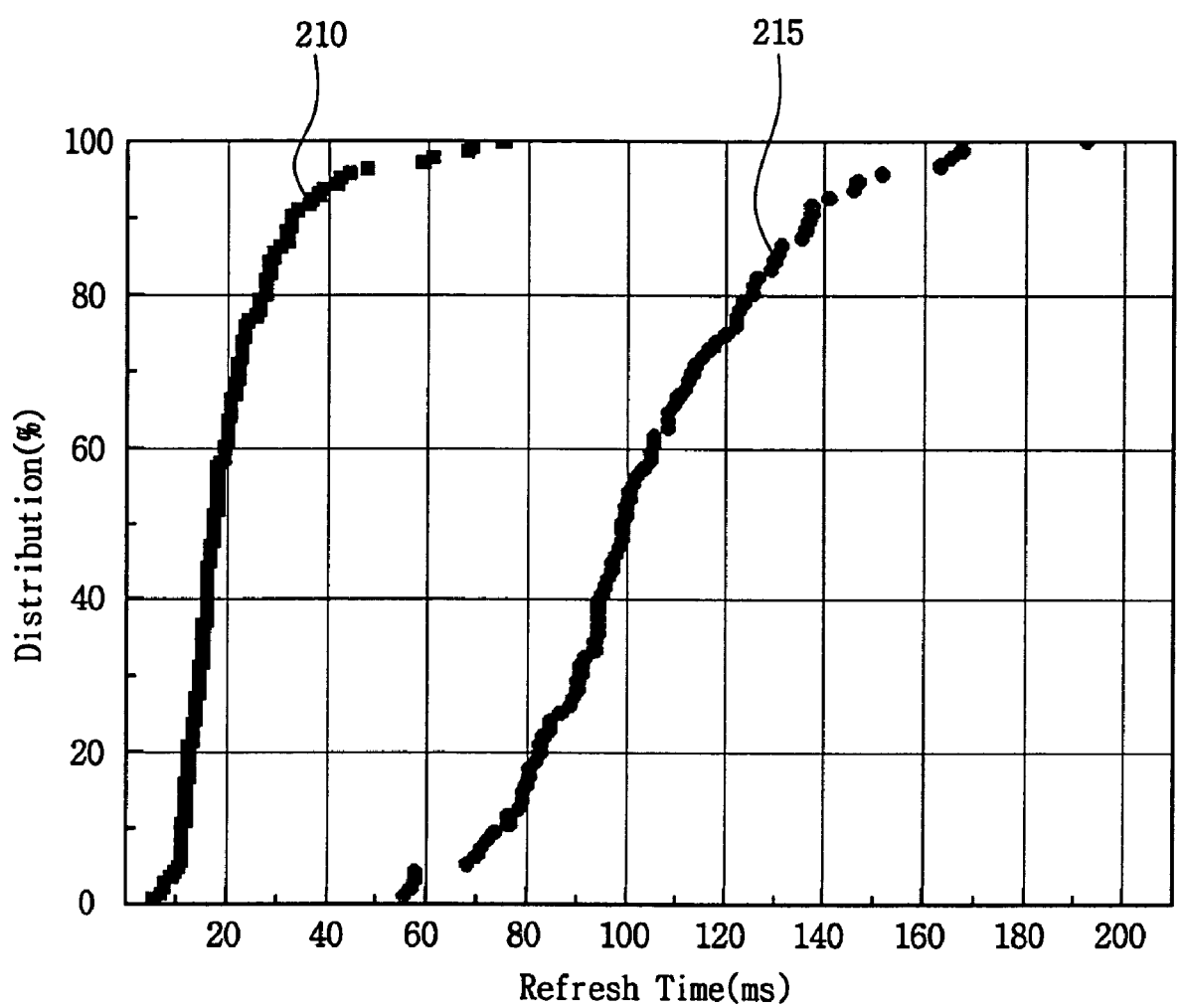

FIGS. 17 and 18 are graphs showing electrical characteristics of DRAMs having a transistor according to an embodiment of the invention.

Referring to FIGS. 17 and 18, two kinds of transistors 200 and 205, and DRAMs 210 and 215 having these transistors, were prepared to extract experimental data related to electrical characteristics. First of all, to compare the electrical characteristics of the transistors 200 and 205, a body effect is checked, which is a ratio of a Vbb (Back-Bias Voltage) to a Vth (Threshold voltage). One of the transistors 205 (not shown) is formed so that the channel region has a predetermined depth below the main surface of the semiconductor substrate 10 to contact both sides of the device isolation layer 20 along the active region 25. The other transistor 200 is formed to have the channel region 125 of FIG. 14.

At this time, while driving one of the transistors 205, a back bias is applied to the channel region below the main surface of the semiconductor substrate 10, so that the body effect is increased in proportion to a volume of the channel region between both sides of the device isolation layer 20. This refers to a tendency to increase the threshold voltage at the same $V_{BB}$ in the case of fixing a channel length of the transistors 200, 205. While driving the other transistors 200, the back bias is applied to the channel region 125 disposed only between the first line patterns 100 of FIG. 16, so that the body effect is reduced compared with the transistor 205. Accordingly, the body effect of the transistors 200 and 205 is shown in FIG. 17, where FIG. 17 supports the foregoing description.

Further, to compare electrical characteristics of the DRAMs 210 and 215 having the transistors 200 and 205, a number of failed bits were counted according to a static refresh time.

One of the DRAMs 215 includes the transistor 205 so that the channel region is formed between both sides of the device isolation layer 20. That is, the DRAM 215 is formed so that all of the junctions of the channel region and the electrode impurity regions 145 have the same depth as the junction 154 disposed between the first line patterns 100 of FIG. 14. Since the junctions and the physical damage caused from the semiconductor fabrication process are overlapped with each other, this cannot block a leakage current of the capacitor that flows along a dislocation. Therefore, the DRAM 215 having the channel region shows many failed bits according to the refresh time.

However, the other DRAM 210 is formed to have the same channel region 125 as shown in FIG. 14, in which the junctions 150 and 158 disposed below the capacitor nodes 180 and 188 are not overlapped with the physical damage, so that the leakage current flowing along the dislocation is made relatively smaller than that of the above DRAM 215.

As described above, the invention provides a proper way to minimize the body effect of a transistor by forming a channel region between at least two channel-portion holes. A DRAM having the transistor can maximize a current driving capability, and further, increase the refresh characteristics of the cell array region.

Embodiments of the invention will now be described in a non-limiting way.

Embodiments of the invention provide transistors having a channel region between channel-portion holes and methods of forming the same.

According to some embodiments of the invention, there is provided transistors having channel region between channel-portion holes that includes at least two channel-portion holes disposed in a semiconductor substrate. Line patterns are disposed in parallel to be spaced apart from each other on a main surface of the semiconductor substrate to fill the channel-portion holes. A channel region is disposed in the semiconductor substrate below the line patterns. At this time, the channel region is disposed between the channel-portion holes and also covers lower portions of the channel-portion holes.

According to some embodiments of the invention, transistors have a channel region between channel-portion holes in a DRAM cell that includes an active region isolated by a device isolation layer. At least two channel-portion holes are disposed in a semiconductor substrate below the active region. First line patterns are disposed in parallel to be spaced apart from each other on the active region to fill the channel-portion holes. Second line patterns are disposed on the device isolation layer along with the first line patterns, each being adjacent to the active region and being in parallel with and opposite to at least one of the first line patterns. A channel region is disposed in the semiconductor substrate below the first and second patterns. The channel region is disposed between the channel-portion holes and also covers lower portions of the channel-portion holes.

According to some embodiments of the invention, methods that form transistors have a channel region between channel-portion holes that includes forming pad layer patterns to expose a main surface of a semiconductor substrate. The semiconductor substrate is etched by using the pad layer patterns as an etching mask to form at least two channel-portion holes extending downward from the main surface of the semiconductor substrate. The pad layer patterns are removed from the semiconductor substrate. Line patterns are formed on the semiconductor substrate, each of the line patterns being formed to fill the channel-portion holes. A channel region covers lower portions of the channel-portion holes.

According to some embodiments of the invention, methods that form transistors have a channel region between channel-portion holes in a DRAM cell that includes forming a device isolation layer isolating an active region of a semiconductor substrate. Pad layer patterns are formed on the semiconductor substrate having the device isolation layer, the pad layer patterns exposing a main surface of the semiconductor substrate of the active region. An etching process is performed in the semiconductor substrate by using the pad layer patterns as an etching mask to form at least two channel-portion holes extending downward from the main surface of the semiconductor substrate. The pad layer patterns are removed from the semiconductor substrate. First line patterns and second line patterns are formed on the device isolation layer and the active region, respectively. The second line patterns being formed to be disposed opposite to at least one of the first line patterns, and the first line patterns being formed to fill the channel-portion holes. A channel region covers lower portions of the channel-portion holes.

Although the invention has been described with reference to the preferred embodiments thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

What is claimed is:

1. A semiconductor device comprising:
   at least two channel-portion holes disposed in a semiconductor substrate;
   line patterns filling the channel-portion holes and disposed in parallel to be spaced apart from each other on a main surface of the semiconductor substrate, wherein each line pattern includes a gate electrode; and
   a channel region disposed in the semiconductor substrate directly under a portion of the line patterns that are within the channel-portion holes,
   wherein the channel region is disposed between the channel-portion holes and wherein lower portions of at least two of the channel-portion holes cover the same channel region;
   a source region disposed in the main surface of the semiconductor substrate and overlapped by one sidewall of one of the line patterns; and
   a drain region disposed in the main surface of the semiconductor substrate and overlapped by another sidewall of the one of the line patterns,
   wherein the source region and the drain region are laterally spaced apart from each other by the channel region.

2. The semiconductor device according to claim 1, wherein each line pattern further includes a gate capping layer pattern stacked on the gate electrode.

3. The semiconductor device according to claim 1, wherein the channel-portion holes have a trench shape.

4. The semiconductor device according to claim 1, wherein the channel region and the semiconductor substrate have different conductivity types from each other.

5. The semiconductor device according to claim 1, further comprising line insulating layer patterns conformally disposed between the line patterns and the semiconductor substrate.

6. The semiconductor device according to claim 5, wherein one side of the line insulating layer pattern is in contact with the line pattern and the opposite side of the line insulating layer pattern is in contact with the channel region.

7. The semiconductor device according to claim 1, wherein the channel region covers a bottom surface and a side surface of at least one of the at least two channel-portion holes.

8. The semiconductor device according to claim 1, wherein the gate electrode fills the channel-portion hole and has a conductivity type different from that of the channel region.

9. The semiconductor device according to claim 1, wherein the channel region and the semiconductor substrate have a same conductivity type.

10. The semiconductor device according to claim 1, wherein the source region or the drain region extends contiguously from a sidewall of the one of the line patterns to a sidewall of another of the line patterns.

11. A semiconductor device comprising:
at least two channel-portion holes disposed in a semiconductor substrate;
line patterns filling the channel-portion holes and disposed in parallel to be spaced apart from each other on a main surface of the semiconductor substrate;
a channel region disposed in the semiconductor substrate directly under a portion of the line patterns that are within the channel-portion holes,
a source region disposed in the main surface of the semiconductor substrate and overlapped by one sidewall of one of the line patterns; and
a drain region disposed in the main surface of the semiconductor substrate and overlapped by another sidewall of the one of the line patterns,
wherein the channel region is disposed between the channel-portion holes and wherein lower portions of at least two of the channel-portion holes cover the same channel region, and
wherein the channel region and the semiconductor substrate have a same conductivity type.

12. A semiconductor device comprising:
at least two channel-portion holes disposed in a semiconductor substrate;
line patterns filling the channel-portion holes and disposed in parallel to be spaced apart from each other on a main surface of the semiconductor substrate; and
a channel region disposed in the semiconductor substrate directly under a portion of the line patterns that are within the channel-portion holes;
line spacers disposed respectively on sidewalls of the line patterns;
electrode impurity regions disposed in the semiconductor substrate and overlapping with the line patterns; and
landing pads disposed between the line patterns and extending from upper portions of the line patterns and also covered with an interlayer insulating layer,
wherein the landing pads contact the electrode impurity regions, respectively, and the electrode impurity regions have a conductivity type different from that of the channel region, and
wherein the channel region is disposed between the channel-portion holes and also covers lower portions of the channel-portion holes.

13. The semiconductor device according to claim 12, wherein the landing pads are a conductive layer having the same conductivity type as the electrode impurity regions.

14. The semiconductor device according to claim 12, wherein the line spacers are insulating layers having an etching ratio different from an oxide layer.

* * * * *

UNITED STATES PATENT AND TRADEMARK OFFICE
CERTIFICATE OF CORRECTION

PATENT NO. : 7,492,004 B2  Page 1 of 1
APPLICATION NO. : 11/054104
DATED : February 17, 2009
INVENTOR(S) : Jin-Woo Lee et al.

It is certified that error appears in the above-identified patent and that said Letters Patent is hereby corrected as shown below:

Column 9, line 9, the word "holes," should read -- holes --.

Signed and Sealed this

First Day of September, 2009

David J. Kappos
*Director of the United States Patent and Trademark Office*